United States Patent [19]
Liao

[11] Patent Number: 5,700,741
[45] Date of Patent: Dec. 23, 1997

[54] PLASMA PURGE METHOD FOR PLASMA PROCESS PARTICLE CONTROL

[75] Inventor: Chin-Cherng Liao, Hsinchu, Taiwan

[73] Assignee: Vanguard International Semiconductor Corporation, Hsin-Chu, Taiwan

[21] Appl. No.: 650,396

[22] Filed: May 20, 1996

[51] Int. Cl.$^6$ ............................................. H01L 21/00
[52] U.S. Cl. ..................... 438/723; 438/732; 438/905; 216/67; 134/1.2
[58] Field of Search ..................... 438/694, 714, 438/723, 726, 732, 734, 743, 758, 788, 792, 905; 216/67; 134/1, 1.1, 1.2

[56] References Cited

U.S. PATENT DOCUMENTS

| | | | |
|---|---|---|---|
| 5,403,780 | 4/1995 | Jain et al. | 437/195 |
| 5,637,190 | 6/1997 | Liao | 216/67 X |
| 5,647,953 | 7/1997 | Williams et al. | 216/67 X |

*Primary Examiner*—William Powell
*Attorney, Agent, or Firm*—George O. Saile; Stephen B. Ackerman; Alek P. Szecsy

[57] ABSTRACT

A method for limiting contaminant particle deposition upon integrated circuit layers within plasma assisted process reactor chambers. First, there is undertaken a plasma assisted process upon an integrated circuit layer within a plasma assisted process reactor chamber. The plasma assisted process employs a reactant gas composition, a first radio frequency power and a first reactor chamber pressure appropriate to the plasma assisted process and the integrated circuit layer. There is then undertaken a first plasma purge step for a first purge time immediately following the plasma assisted process. The first plasma purge step employs a first purge gas composition, a second radio frequency power and a second reactor chamber pressure. The second radio frequency power is lower than the first radio frequency power and the second reactor chamber pressure is higher than the first reactor chamber pressure. Optionally, there may also be undertaken a second plasma purge step for a second purge time immediately following the first plasma purge step. The second plasma purge step employs a second purge gas composition, a third radio frequency power and a third reactor chamber pressure. The third radio frequency power is no greater than the second radio frequency power and the third reactor chamber pressure is lower than the second reactor chamber pressure.

26 Claims, 1 Drawing Sheet

PLASMA PURGE METHOD FOR PLASMA PROCESS PARTICLE CONTROL

BACKGROUND OF THE INVENTION

1. Field of the Invention

The present invention relates generally to plasma assisted methods for processing integrated circuit layers. More particularly, the present invention relates to plasma assisted methods for processing integrated circuit layers, which plasma assisted methods provide limited contaminant particle deposition upon those integrated circuit layers.

2. Description of the Related Art

Known in the art of integrated circuit manufacture is the use of radio frequency plasma exaltation to produce reactive and non-reactive plasmas which assist in processing integrated circuit layers. The plasmas which assist in processing integrated circuit layers may be employed within several integrated circuit layer fabrication processes. The plasmas may be employed in integrated circuit layer fabrication processes including but not limited to integrated circuit layer formation processes, integrated circuit layer removal processes and integrated circuit layer modification processes. The types of integrated circuit layers whose fabrication may be assisted through the use of radio frequency plasmas include but are not limited to integrated circuit conductor layers, integrated dreuit insulator layers, integrated circuit semiconductor layers and integrated circuit photoactive layers.

Although the use of radio frequency excitation to produce plasmas which have applications within many aspects of integrated circuit layer fabrication have become quite common in the art, such plasmas are not without problems. In particular, one of the more troubling problems resulting from plasma assisted processing of integrated circuit layers is the formation of contaminant particles within plasma assisted process reactor chambers and the deposition of those contaminant particles upon the surfaces of integrated circuit layers which are intended to be processed by plasmas contained within those plasma assisted process reactor chambers. The contaminant particles may be generated from several sources, including but not limited to the materials from which is formed the plasma and the materials from which is formed the process reactor chamber within which is contained the plasma. When deposited upon an integrated circuit layer for whose processing a radio frequency plasma is intended, the particles resulting from these materials often assist in forming defects which impede production of fully functional and reliable integrated circuits.

Several aspects of the dynamics of contaminant particle formation and deposition within radio frequency plasma assisted integrated circuit layer fabrication processes and process reactor chambers are known in the art. For example, it is known in the art that radio frequency plasma induced electrostatic forces are likely to play significant roles in contaminant particle deposition upon integrated circuit layers exposed to a radio frequency plasma within a plasma assisted process reactor chamber. Alternatively, it is also known that non-electrostatic forces, such as ternperamre gradient forces, fluid dynamic drag forces and gravitational forces are likely to play more significant roles in contaminant particle deposition upon integrated circuit layers within process reactor chambers absent a radio frequency plasma. It is thus towards the control of contaminant particles within radio frequency plasma assisted integrated circuit layer processing reactor chambers through methods that preferably derive from an understanding of particle formation and deposition dynamics within those chambers that the present invention is directed.

Methods through which various features of plasma assisted integrated circuit layer processing methods may be influenced through understanding of the technical principles upon which those processes are based are known in the art. For example, Jain et al., in U.S. Pat. No. 5,403,780 disclose a method for enhancing the planarization etch-back profile, the stability and the reliability of silicon oxide insulator layers formed through plasma assisted etching processes. The disclosed method employs a composite silicon oxide insulator layer, portions of which are formed with a silicon content tailored to provide the desired planarization, stability and reliability characteristics of the composite silicon oxide insulator layer.

In addition, there is also disclosed in a commonly assigned related application from this laboratory a two-step plasma purge method whereby contaminant particle deposition upon integrated circuit layers within various types of plasma assisted processes may be limited. See, C. C. Liao, "Plasma Purge Method for Plasma Process Particle Control," U.S. patent application Ser. No. 08/529013, filed 15 Sep. 1995, now U.S. Pat. No. 5,637,190, the teachings of which are incorporated herein fully, by reference.

Desirable in the art are additional methods which employ an understanding of particle generation and deposition phenomena to analogously provide additional radio frequency plasma assisted integrated circuit layer processes through which contaminant particle deposition upon integrated circuit layers within plasma assisted process reactor chambers may be limited. Highly desirable is methodology which is generally applicable to a wide variety of plasma assisted integrated circuit layer processes and plasma assisted process reactor chambers while simultaneously being undertaken through a minimal number of process steps.

SUMMARY OF THE INVENTION

A first object of the present invention is to provide a method for limiting contaminant particle deposition upon integrated circuit layers within plasma assisted process reactor chambers, the method so provided being generally applicable to a wide variety of plasma assisted processes and plasma hssisted process reactor chambers.

A second object of the present invention is to provide a method in accord with the first object ofthe present invention, which method may be undertaken with a minimal number of process steps.

A third object of the present invention is to provide a method in accord with the first object ofthe present invention and the second object of the present invention, which method is also manufacturable.

In accord with the objects of the present invention, there is provided by the present invention a method for limiting contaminant particle deposition upon integrated circuit layers within plasma assisted process reactor chambers. To practice the method of the present invention, there is first undertaken a plasma assisted process upon an integrated circuit layer within a plasma assisted process reactor chamber. The plasma assisted process employs a reactant gas composition, a first radio frequency power and a first reactor chamber pressure appropriate to the plasma assisted process and the integrated circuit layer. There is then undertaken a first plasma purge step for a first purge time immediately following the plasma assisted process. The first plasma purge step employs a first purge gas composition, a second radio frequency power and a second reactor chamber pressure. The second radio frequency power is lower than the first radio frequency power and the second reactor. chamber pressure is higher than the first reactor chamber pressure. Optionally, there may also be undertaken a second plasma purge step for a second purge time immediately following the first plasma purge step. The second plasma purge step employs a second purge gas composition, a third radio frequency power and a third reactor chamber pressure. The third radio frequency power is no greater than the second radio frequency power and the third reactor chamber pressure is lower than the second reactor chamber pressure.

The method of the present invention is generally applicable in limiting contaminant particle deposition upon integrated circuit layers within plasma assisted process reactor chambers within which are undertaken a wide variety of plasma assisted integrated circuit layer processes. The method of the present invention provides for a minimum of one plasma purge process step immediately following a plasma assisted process undertaken upon an integrated circuit layer within a plasma assisted process reactor chamber. The plasma purge process step is undertaken at a second radio frequency power less than a first radio frequency power provided in the plasma assisted integrated circuit process and a second reactor chamber pressure higher than a first reactor chamber pressure provided in the plasma assisted integrated circuit process. By undertaking the first plasma purge process step at the second radio frequency power lower than the first radio frequency power and the second reactor chamber pressure higher than the first reactor chamber pressure, the particles which would otherwise deposit upon the integrated circuit layer within the plasma assisted process reactor chamber are presumably diluted and polarized away from the integrated circuit layer. Through the optional second plasma purge process step of the plasma purge method of the present invention, which employs a third radio frequency power no greater than the second radio frequency power and a third reactor chamber pressure less than the second reactor chamber pressure, the particles are polarized further away from the integrated circuit layer and exhausted from the plasma assisted process reactor chamber.

The method of the present invention is readily manufacturable and may be undertaken with a minimum number of process steps. The method of the present invention may be undertaken as a one-step plasma purge process following a plasma assisted process in a plasma assisted process reactor chamber. For superior performance of the method of the present invention, the method of the present invention may optionally include a second plasma purge step immediately following the first plasma purge process step, thus forming a two-step plasma purge process. Both the first plasma purge process step and the optional second plasma purge process step are undertaken through modification of radio frequency power, reactor chamber pressure and gas composition parameters which are common in the art of plasma assisted integrated circuit layer processing within integrated circuits. Thus, the method of the present invention is readily manufacturable and may be undertaken with a minimum number of additional process steps.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
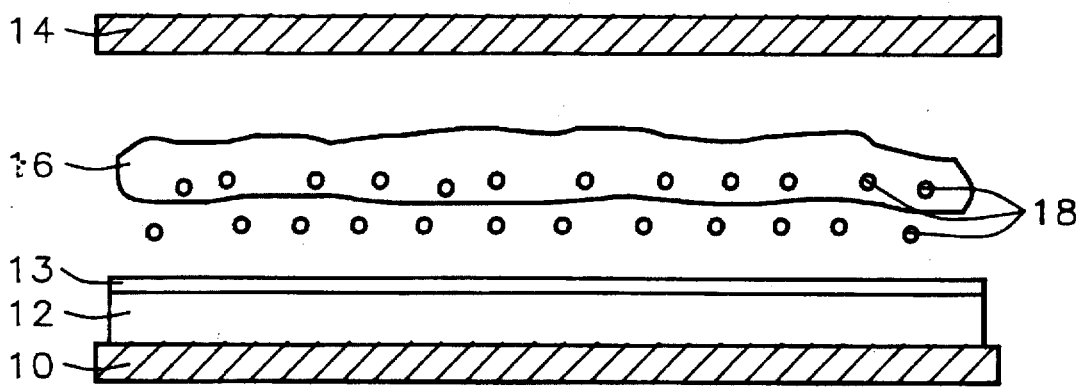
FIG. 1 to FIG. 3 show a series of schematic cross-sectional diagrams illustrating the electrodes and plasma within a plasma assisted process reactor chamber in accord with progressive stages of the first preferred embodiment of the plasma purge method of the present invention.

The present invention provides a method for limiting contaminant particle deposition upon integrated circuit layers within plasma assisted process reactor chambers. To achieve that goal, the method of the present invention incorporates a minimum of one plasma purge process step for a first purge time immediately subsequent to a plasma assisted integrated circuit layer process. Both the plasma purge process step and the plasma assisted integrated circuit layer process are undertaken within a plasma assisted process reactor chamber. By employing within the plasma purge process step: (1) a first purge gas composition; (2) a second radio frequency power less than a first radio frequency power employed in the plasma assisted integrated circuit layer process; and (3) a second reactor chamber pressure greater than a first reactor chamber pressure employed in the plasma assisted integrated circuit layer process, fewer contaminant particles are deposited upon plasma assisted processed integrated circuit layers which have been exposed to the plasma purge process step of the present invention than equivalent plasma assisted processed integrated circuit layers which have not benefitted from exposure to the plasma purge process step of the plasma purge method of the present invention.

The plasma purge method of the present invention optionally includes a second plasma purge process step for a second purge time immediately following the first plasma purge process step. The second plasma purge process step employs: (1) a second purge gas composition; (2) a third radio frequency power no greater than the second radio frequency power employed in the first plasma purge process step; and (3) a third reactor chamber pressure less than the second reactor chamber pressure employed in the first plasma purge process step. Through the optional two-step plasma purge process of the plasma purge method of the present invention, fewer particles are deposited upon plasma assisted processed integrated circuit layers which have been exposed to the optional two-step plasma purge process than otherwise equivalent plasma assisted processed integrated circuit layers which: (1) have been exposed to only the one-step plasma purge process of the plasma purge method of the present invention; or (2) have not benefitted from exposure to either the one-step plasma purge process or the optional two-step plasma purge process of the plasma purge method of the present invention.

The one-step plasma purge process step of the method of the present invention, with or without the optional second plasma purge process step, may be employed immediately subsequent to plasma assisted integrated circuit layer processing of any integrated circuit layer prone to contaminant particulate deposition within plasma assisted integrated circuit layer processes within plasma assisted process reactor chambers. The plasma purge method of the present invention may be employed following plasma assisted integrated circuit layer processing of integrated circuit layers which are formed into integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The plasma purge method of the present invention has broad applicability within integrated circuit processing.

Figure 2:
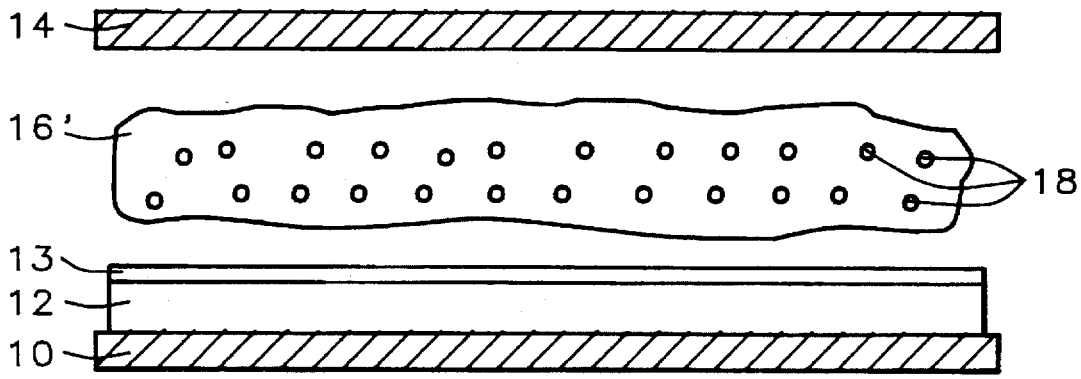
Figure 3:
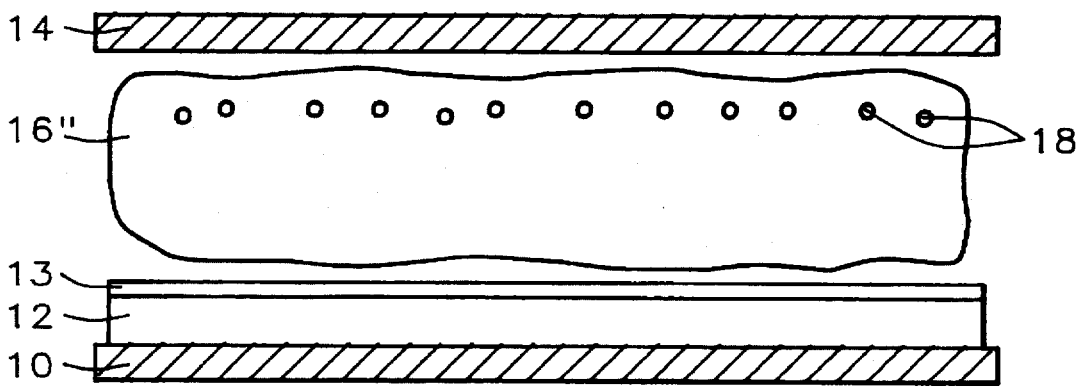

Referring now to FIG. 1 to FIG. 3 there is shown a series of schematic cross-sectional diagrams illustrating the electrodes and plasma within a plasma assisted process reactor chamber in accord with the first preferred embodiment of the plasma purge method of the present invention. The first preferred embodiment of the plasma purge method of the present invention is a general embodiment where the plasma purge method of the present invention follows any plasma assisted integrated circuit layer process within a plasma assisted process reactor chamber. Two additional preferred embodiments of the plasma purge method of the present invention will be described following the first preferred embodiment of the plasma purge method of the present invention. The two additional preferred embodiments of the plasma purge method of the present invention include a second preferred embodiment of the plasma purge method of the present invention where the plasma purge method of the present invention is incorporated after a plasma assisted silicon oxide integrated circuit layer etch process and a third preferred embodiment of the plasma purge method of the present invention where the plasma purge method of the present invention is incorporated after a plasma assisted silicon oxide integrated circuit layer deposition process.

Referring now to FIG. 1, there is shown a schematic cross-sectional diagram of the electrodes and plasma within a plasma assisted process reactor chamber at a point in time at which an integrated circuit layer is being processed with the plasma (the plasma assisted process reactor chamber is not shown). Shown in FIG. 1 is an anode 10 upon which is placed a semiconductor substrate 12. Opposite the semiconductor substrate 12 is a cathode 14. Between the cathode 14 and the semiconductor substrate 12 is formed a plasma 16. The plasma 16 is employed in processing an integrated circuit layer 13 which is formed upon the upper exposed surface of the semiconductor substrate 12. Also shown in FIG. 1 is the presence of particles 18 within and adjoining the plasma 16 near the surface of the integrated circuit layer 13 formed upon the semiconductor substrate 12. As illustrated in FIG. 1, the particles 18 are localized in a plane close to the surface of the integrated circuit layer 13. The presence of the particles 18 in this location is common in plasma assisted integrated circuit layer processes undertaken in plasma assisted process reactor chambers, the plasmas being formed in the range of about 200 to about 950 watts radio frequency plasma power and about 200 to about 3000 mtorr reactor chamber pressure.

The plasma 16 illustrated within the schematic cross-sectional diagram of FIG. 1 may be employed in a broad range of plasma assisted processes by which integrated circuit layers are fabricated. The plasma 16 illustrated in the schematic cross-sectional diagram of FIG. 1 may be employed in plasma assisted integrated drcuit layer fabrication processes including but not limited to plasma assisted integrated circuit layer formation processes, plasma assisted integrated circuit layer removal processes and plasma assisted integrated circuit layer modification processes. In addition, the integrated circuit layer 13 which is formed upon the semiconductor substrate 12 may include a broad range of integrated circuit layers which are conventionally processed through plasma assisted integrated circuit layer fabrication processes. The integrated circuit layer 13 which is formed upon the semiconductor substrate 12 may include, but is not limited to, the group of integrated circuit layers consisting of integrated circuit conductor layers, integrated circuit insulator layers, integrated circuit semiconductor layers and integrated circuit photo-active layers.

In order to process the integrated circuit layer 13, the plasma 16 of the first preferred embodiment of the method of the present invention employs a reactant gas composition, a first radio frequency power and a first reactor chamber pressure appropriate to the plasma assisted process and the integrated circuit layer. Typically and preferably, the first radio frequency power will be in the range of from about 200 to about 950 watts. Typically and preferably, the first reactor chamber pressure will be in the range of from about 200 to about 3000 mtorr.

Referring now to FIG. 2, there is shown a schematic cross-sectional diagram illustrating the electrodes and plasma within a plasma assisted process reactor chamber in accord with the one-step plasma purge process of the plasma purge method of the present invention. Illustrated within FIG. 2 are the same features as are illustrated within FIG. 1 with the exception that the size of the plasma has increased to encompass a plasma 16' within FIG. 2. In addition, the plane encompassing the high concentration of particles 18 has moved further away from the surface of the integrated circuit layer 13 formed upon the semiconductor substrate 12. These changes in the size of the plasma 16 and the location of the particles 18 result from the first plasma purge process step of the first preferred embodiment of the plasma purge method of the present invention.

The first plasma purge process step is undertaken immediately following the plasma assisted process of the first preferred embodiment of the plasma purge method of the present invention. The first plasma purge process step is preferably undertaken for a first purge time of from about 5 to about 30 seconds. The first plasma purge process step employs a first purge gas composition, a second radio frequency power and a second reactor chamber pressure. The second radio frequency power is lower than the first radio frequency power and the second reactor chamber pressure is higher than the first reactor chamber pressure.

To provide optimal value in limiting particulate contaminant deposition upon integrated the integrated circuit layer 13 through the first preferred embodiment of the plasma purge method of the present invention, it has been found experimentally that the second radio frequency power is preferably from about 20 to about 50 percent of the first radio frequency power employed in the plasma assisted process by which the integrated circuit layer 13 is processed. Analogously, the second reactor chamber pressure is preferably from about 150 to about 400 percent of the first reactor chamber pressure employed in the plasma assisted process by which the integrated circuit layer 13 is processed.

Although several types of purge gases are known within integrated circuit manufacture, including but not limited to reactive purge gases, non-reactive purge gases, oxidizing purge gases and non-oxidizing purge gases, for the first preferred embodiment of the plasma purge method of the present invention, the first purge gas composition preferably comprises an oxidizing purge gas component. More preferably, the oxidizing purge gas component is an oxygen oxidizing purge gas component. Most preferably, the oxygen oxidizing purge gas component is provided at a flow rate of from about 80 to about 500 standard cubic centimeters per minute (sccm). Optionally, the first purge gas composition may also comprise a non-oxidizing purge gas component in addition to the oxidizing purge gas component. As a more preferable option, the non-oxidizing purge gas component is an argon non-oxidizing purge gas component. As a most preferable option, the argon non-oxidizing purge gas component is provided at a flow rate of from about 20 to about 200 standard cubic centimeters per minute.

Within the first preferred embodiment of the plasma purge method of the present invention, the first purge gas composition presumably assists in chemically and physically etching any particles 18 that remain within the plasma assisted process reactor chamber after performing the plasma assisted process on the integrated circuit layer 13. In addition, by lowering the first radio frequency power within the plasma assisted process reactor chamber to the second radio frequency power through the first plasma purge step, the particle density within the plasma 16' concentrates at locations more remote from the integrated circuit layer 13 surface. Finally, by increasing the pressure from the first reactor chamber pressure to the second reactor chamber pressure within the first plasma purge step, the concentration of particles 18 per mole of first purge gas within the plasma assisted process reactor chamber will be decreased.

Upon exposing the integrated circuit layer 13 upon the semiconductor substrate 12 to a plasma assisted integrated circuit layer process followed by the first plasma purge step of the first preferred embodiment of the plasma purge method of the present invention, there is found fewer particles upon the integrated circuit layer 13 surface when the semiconductor substrate 12 is removed from the plasma assisted process reactor chamber, in comparison with an otherwise equivalent integrated circuit layer 13 which has not benefitted from the one-step plasma purge process of the first preferred embodiment of the plasma purge method of the present invention.

In order to obtain superior performance of the plasma purge method of the first preferred embodiment of the method of the present invention, it is possible to optionally employ a second plasma purge step immediately following the first plasma purge step. A schematic cross-sectional diagram of the electrodes and plasma within a plasma assisted process reactor chamber in accord with the second plasma purge process step are illustrated in FIG. 3. The schematic cross-sectional diagram of FIG. 3 is otherwise equivalent to the schematic cross-sectional diagram illustrated in FIG. 2 with the exception that the plasma 16' illustrated within FIG. 2 has increased in size to encompass the plasma 16" illustrated within FIG. 3. In addition the plane of high density of particles 18 has continued to be polarized further away from the surface of the integrated circuit layer 13 within FIG. 3.

The second plasma purge step is preferably undertaken for a second plasma purge time of from about 5 to about 15 seconds. The second plasma purge step preferably employs a second purge gas composition, a third radio frequency power and a third reactor chamber pressure. Preferably, the second purge gas composition is equivalent to the first purge gas composition. Preferably, the third radio frequency power is no greater than the second radio frequency power and the third reactor chamber pressure is less than the second reactor chamber pressure.

In order to provide optimal performance of the optional two-step plasma purge process of the first preferred embodiment of the method of the present invention, it has been found experimentally that the third radio frequency power is preferably from about 20 to about 100 percent of the second radio frequency power which is employed in the first plasm purge step. Analogously, it has also been found experimentally that the third reactor chamber pressure is preferably no greater than about 50 percent of the second reactor chamber pressure employed in the first plasma purge step.

Within the second plasma purge step, the purpose of the second purge gas is to continue to chemically and physically etch any particles 18 that continue to remain in the plasma assisted process reactor chamber after the first plasma purge step. In addition, the continued lowering of the radio frequency power from the first plasma purge step to the second plasma purge step provides a continued polarization of particles 18 remaining in the plasma 16' away from the surface of the integrated circuit layer 13. Finally, by re-lowering the reactor chamber pressure from the first plasma purge step to the second plasma purge step, a substantial volume of the second purge gas is removed from the reactor chamber, taking along with it particles 18 which are entrained within that volume of the second purge gas.

It is also known in the art that plasma assisted integrated circuit layer processes, in general, may be accelerated or modified through the application of a magnetic field within those plasma assisted integrated circuit layer processes. The plasma assisted process, the first plasma purge step and the optional second plasm purge step of the first preferred embodiment of the plasma purge method of the present invention may optionally benefit from the application of such a magnetic field. To that end, there are several methods through which magnetic fields may be introduced into plasma assisted process reactor chambers, including but not limited to: (1) incorporation of magnets within the proximity of cathode and anode electrodes within plasma assisted process reactor chambers; and (2) generation of magnetic fields through means external to a plasma assisted process reactor chamber, such as, for example, Electron Cyclotron Resonance (ECR) means. For the first preferred embodiment of the plasma purge method of the present invention, a magnetic field is optionally present during the plasma assisted process, the first plasma purge process step and the optional second plasma purge process step. The magnetic field, if present, is preferably present at a strength of no greater than about 100 gauss.

Upon completing the optional second plasma purge step, the one-step plasma purge process of the first preferred embodiment of the plasma purge method of the present invention has been expanded to provide an optional two-step plasma purge process of the first preferred embodiment of the plasma purge method of the present invention. An integrated circuit layer processed within a plasma assisted process which is followed by the optional two-step plasma purge process of the first preferred embodiment of the plasma purge method of the present invention will exhibit less surface contaminant particulate than: (1) an analogous integrated circuit layer which has not benefitted from the optional two-step plasma purge process of the first preferred embodiment of the plasma purge method of the present invention; or (2) an analogous integrated circuit layer which has benefitted only from the one-step plasma purge process of the first preferred embodiment of the plasma purge method of the present invention.

In addition to the first preferred embodiment of the plasma purge method of the present invention, which embodiment is directed to a general application of the one-step plasma purge process or optional two-step plasma purge process of the present invention, there exist two additional preferred embodiments of the plasma purge method of the present invention which are directed towards specific plasma assisted integrated circuit layer processes which are followed by the one-step or optional two-step plasma purge process of the first preferred embodiment of the plasma purge method of the present invention. The first additional embodiment is directed towards the plasma purge process of the first preferred embodiment of the plasma purge method of the present invention following a plasma assisted silicon oxide integrated circuit layer etch process. This embodiment represents the second preferred embodiment of the plasma purge method of the present invention. The second additional embodiment is directed towards the plasma purge process of the first preferred embodiment of the plasma purge method of the present invention following a plasma assisted integrated circuit layer deposition process. This embodiment represents the third preferred embodiment of the plasma purge method of the present invention.

With regard to the second preferred embodiment of the plasma purge method of the present invention, plasma assisted silicon oxide integrated circuit layer etch processes are generally known in the art of integrated circuit manufacture. Such processes are typically undertaken in plasma assisted process reactor chambers at radio frequency powers and reactor chamber pressures within the range specified for the plasma assisted process of the first preferred embodiment of the plasma purge method of the present invention. In addition, several methods by which silicon oxide integrated circuit layers may be formed upon semiconductor substrates are also generally known. These methods include but are not limited to Chemical Vapor Deposition (CVD) methods, Plasma Enhanced Chemical Vapor Deposition (PECVD) methods, Spin-On-Glass (SOG) deposition methods and Physical Vapor Deposition (PVD) sputtering methods. Any of the foregoing deposition methods may be employed in forming a silicon oxide integrated circuit layer upon which is practiced the plasma purge process of the second preferred embodiment of the plasma purge method of the present invention.

Thus, in order to practice the second preferred embodiment of the plasma purge method of the present invention, a silicon oxide integrated circuit layer is first formed upon a semiconductor substrate. The silicon oxide integrated circuit layer is then etched through a plasma assisted process. The plasma through which the silicon oxide integrated circuit layer is etched is then purged in accord with the plasma purge process of the first preferred embodiment of the plasma purge method of the present invention.

For the second preferred embodiment of the plasma purge method of the present invention, the plasma assisted process by which the silicon oxide integrated circuit layer is etched preferably employs: (1) a first radio frequency power of from about 600 to about 950 watts; (2) a first reactor chamber pressure of from about 200 to about 300 mtorr; (3) a reactant gas composition of tri-fluoro-methane at about 10 to about 100 standard cubic centimeters per minute (sccm), carbon-tetra-fluoride at about 65 to about 100 standard cubic centimeters per minute (sccm) and argon at about 40 to about 80 standard cubic centimeters per minute (sccm); and (4) a magnetic field strength of about 20 to about 100 gauss.

For the second preferred embodiment of the plasma purge method of the present invention, the first plasma purge step preferably employs: (1) a second radio frequency of about 250 to about 350 watts; (2) a second reactor chamber pressure of from about 400 to about 900 mtorr; (3) a first oxygen oxidizing purge gas component at about 100 to about 300 standard cubic centimeters per minute (sccm); and (4) a magnetic field strength of about 20 to about 100 gauss. Optionally, for the second preferred embodiment of the plasma purge method of the present invention, the second plasma purge step preferably employs: (1) a third radio frequency power of from about 50 to about 150 watts; (2) a third reactor chamber pressure of no greater than about 200 mtorr; (3) a second oxygen oxidizing purge gas component of from about 100 to about 200 standard cubic centimeters per minute (sccm); and (4) a magnetic field strength of from about 20 to about 100 gauss.

Upon plasma assisted silicon oxide integrated circuit layer etch processing followed by the one-step or optional two-step plasma purge process of the second preferred embodiment of the plasma purge method of the present invention, there is formed an etched silicon oxide integrated circuit layer upon a semiconductor substrate, which etched silicon oxide integrated circuit layer has fewer contaminant particles deposited upon its surface than an equivalently etched silicon oxide integrated circuit layer which has not benefitted from exposure to the one-step or optional two step plasma purge process of the second preferred embodiment of the plasma purge method of the present invention.

With regard to the third preferred embodiment of the plasma purge method of the present invention, plasma assisted processes by which silicon oxide integrated circuit layers may be deposited are also known in the art. Such plasma assisted processes typically employ suitable silicon source reactant gases such as silane and Tetra Ethyl Ortho Silicate (TEOS). Either of these two silicon source reactant gases may be employed in the third preferred embodiment of the plasma purge method of the present invention.

For the third preferred embodiment of the plasma purge method of the present invention, the plasma assisted process by which the silicon oxide integrated circuit layer is deposited from the silane or Tetra Ethyl Ortho Silicate (TEOS) silicon source reactant gases preferably employs: (1) a first radio frequency power of from about 200 to about 700 watts; (2) a first reactor chamber pressure of from about 500 to about 3000 mtorr; and (3) a silicon source reactant gas flow rate of about 100 to about 600 standard cubic centimeters per minute (sccm). No magnetic field is typically employed in this process.

For the third preferred embodiment of the plasma purge method of the present invention, the one-step plasma purge process preferably employs: (1) a second radio frequency of from about 50 to about 300 watts; (2) a second reactor chamber pressure of from about 2000 to about 7000 mtorr; and (3) an oxygen oxidizing purge gas component at about 100 to about 200 standard cubic centimeters per minute. Analogously, for the third preferred embodiment of the plasma purge method of the present invention, the optional second plasma purge step preferably employs: (1) a third radio frequency power of from about 20 to about 150 watts; (2) a third reactor chamber pressure of no greater than about 500 mtorr; and (3) an oxygen oxidizing purge gas component at a flow rate of from about 100 to about 200 standard cubic centimeters per minute (sccm).

Upon plasma assisted silicon oxide integrated circuit layer deposition followed by the one-step or optional two-step plasma purge process in accord with the third preferred embodiment of the plasma purge method of the present invention, there is deposited a silicon oxide integrated circuit layer upon a semiconductor substrate, which silicon oxide integrated circuit layer has fewer contaminant particles deposited upon its surface than an equivalently deposited silicon oxide integrated circuit layer which has not benefitted from exposure to the one-step or optional two-step plasma purge process of the third preferred embodiment of the plasma purge method of the present invention.

EXAMPLES

Three series of eight inch wide semiconductor substrates had formed upon their surfaces silicon oxide integrated circuit layers. The silicon oxide integrated circuit layers were formed through either Spin-On-Glass silicon oxide integrated circuit layer processes or Plasma Enhanced Chemical Vapor Deposited (PECVD) silicon oxide integrated circuit layer processes through methods and materials as are conventional in the art. The thickness of the silicon oxide integrated circuit layers were in the range of from about 3000 to about 15000 angstroms. The surfaces of all of the silicon oxide integrated circuit layers were measured through techniques as are conventional in the art to determine the level of surface contaminant particulate initially residing upon those surfaces.

The silicon oxide integrated circuit layers upon one of the three series of semiconductor substrates were then exposed to a plasma assisted etch process in accord with the plasma assisted etch process outlined for the second preferred embodiment of the plasma purge method of the present invention. The plasma assisted etch process employed: (1) a first radio frequency power of about 850 watts; (2) a first reactor chamber pressure of about 260 mtorr; (3) a reactant gas composition of tri-fluoro-methane at about 40 standard cubic centimeters per minute, carbon-tetra-fluoride at about 100 standard cubic centimeters per minute (sccm) and argon at about 50 standard cubic centimeters per minute; and (4) a magnetic field strength of about 50 gauss.

The silicon oxide integrated circuit layers upon a second of the three series of semiconductor substrates received the same plasma assisted etch process as provided for the silicon oxide integrated circuit layers upon the first series of semiconductor substrates. The silicon oxide integrated circuit layers upon the second series of semiconductor substrates were, however, additionally exposed to a one-step plasma purge process in accord with the second preferred embodiment of the plasma purge method of the present invention. The one-step plasma purge process employed: (1) a second radio frequency power of about 250 watts; (2) a second reactor chamber pressure of about 400 mtorr; (3) a first oxygen oxidizing purge gas component at about 300 standard cubic centimeters per minute (sccm); (4) a magnetic field strength of about 50 gauss; and (5) a first purge time of about 10 seconds.

Finally, the silicon oxide integrated circuit layers upon the third of the three series of semiconductor substrate wafers was exposed to a plasma assisted etch process followed by an optional two-step plasma purge process in accord with the second preferred embodiment of the plasma purge method of the present invention. The silicon oxide integrated circuit layers upon the third series of semiconductor substrates received the same plasma assisted etch process and one-step plasma purge process as provided for the silicon oxide integrated circuit layers upon the second of the three series of semiconductor substrate wafers. Additionally, the silicon oxide integrated circuit layers upon the third series of semiconductor substrates also received an optional second plasma purge step in accord with the second preferred embodiment of the plasma purge method of the present invention. The second plasma purge step employed: (1) a third radio frequency power of about 100 watts; (2) a third reactor chamber pressure of about 50 mtorr; (3) a second oxygen oxidizing purge gas component at about 200 standard cubic centimeters per minute (sccm); (4) a magnetic field strength of about 60 gauss; and (5) a second purge time of about 5 seconds.

Each of the silicon oxide integrated circuit layers was then re-measured to determine the level of surface contaminant particulate added through the plasma assisted silicon oxide integrated circuit layer etch processes. The results of these measurements are reported in TABLE I.

TABLE I

| Process Conditions | Particles Added Per Wafer |
|---|---|
| Etch Without Plasma Purge | 250 +/− 50 |
| Etch With One-Step Plasma Purge | 30 +/− 8 |
| Etch With Two-Step Plasma Purge | 25 +/− 5 |

From review of the data of TABLE I it is seen that either the one-step plasma purge process or the optional two-step plasma purge process, when applied within the context of the second preferred embodiment of the plasma purge method of the present invention, provides an etched silicon oxide integrated circuit layer having fewer contaminant particles deposited upon its surface than an equivalently etched silicon oxide integrated circuit layer which has not benefitted from the one-step plasma purge process or the optional two-step plasma purge process of the second preferred embodiment of the plasma purge method of the present invention.

As is understood by a person skilled in the art, the preferred embodiments and examples of the present invention are illustrative of the present invention rather than limiting of the present invention. Modifications and variations upon the methods and materials through which is practiced the preferred embodiments and examples of the present invention may yield additional embodiments and examples which are within the spirit and scope of the plasma purge method of the present invention, as defined by the accompanying claims.

What is claimed is:

1. A method for limiting contaminant particle deposition upon integrated circuit layers within plasma assisted process reactor chambers comprising:

undertaking a plasma assisted process upon an integrated circuit layer within a plasma assisted process reactor chamber, the plasma assisted process employing a reactant gas composition, a first radio frequency power and a first reactor chamber pressure appropriate to the plasma assisted process and the integrated circuit layer;

undertaking a first plasma purge step for a first purge time immediately following the plasma assisted process, the first plasma purge step employing a first purge gas composition, a second radio frequency power and a second reactor chamber pressure, the second radio frequency power being lower than the first radio frequency power and the second reactor chamber pressure being higher than the first reactor chamber pressure.

2. The method of claim 1 wherein the plasma assisted process is chosen from the group of plasma assisted processes consisting of plasma assisted integrated circuit layer formation processes, plasma assisted integrated circuit layer removal processes and plasma assisted integrated circuit layer modification processes.

3. The method of claim 1 wherein the integrated circuit layer is chosen from the group of integrated circuit layers consisting of integrated circuit conductor layers, integrated circuit insulator layers, integrated circuit semiconductor layers and integrated circuit photo-active layers.

4. The method of claim 1 wherein the first radio frequency power is from about 200 to about 950 watts and the first reactor chamber pressure is from about 200 to about 3000 mtorr.

5. The method of claim 1 wherein the first purge time is from about 5 to about 30 seconds.

6. The method of claim 1 wherein the first purge gas composition comprises an oxidizing first purge gas component.

7. The method of claim 6 wherein the oxidizing first purge gas component comprises an oxygen oxidizing first purge gas component.

8. The method of claim 7 wherein the oxygen oxidizing first purge gas component is provided at an oxygen flow rate of from about 80 to about 500 standard cubic centimeters per minute (sccm).

9. The method of claim 1 wherein the first purge gas composition further comprises a non-oxidizing first purge gas component in addition to the oxidizing first purge gas component.

10. The method of claim 9 wherein the non-oxidizing first purge gas component is an argon non-oxidizing first purge gas component.

11. The method of claim 10 wherein the argon non-oxidizing first purge gas component is provided at a flow rate of from about 20 to about 200 standard cubic centimeters per minute (sccm).

12. The method of claim 1 wherein the second radio frequency power is from about 20 to about 50 percent of the first radio frequency power and the second reactor chamber pressure is from about 150 to about 400 percent of the first reactor chamber pressure.

13. The method of claim 1 further comprising undertaking a second plasma purge step for a second purge time immediately following the first plasma purge step, the second plasma purge step employing a second purge gas composition, a third radio frequency power and a third reactor chamber pressure, the third radio frequency power being no greater than the second radio frequency power and the third reactor chamber pressure being lower than the second reactor chamber pressure.

14. The method of claim 13 wherein the second purge time is from about 5 to about 15 seconds.

15. The method of claim 13 wherein the second purge gas composition is equivalent to the first purge gas composition.

16. The method of claim 13 wherein the third radio frequency power is from about 20 to about 100 percent of the second radio frequency power and the third reactor chamber pressure is no greater than about 50 percent of the second reactor chamber pressure.

17. A method for limiting contaminant particle deposition upon silicon oxide integrated circuit layers etched within plasma assisted process reactor chambers comprising:

etching through a plasma assisted process a silicon oxide integrated circuit layer within a plasma assisted process reactor chamber, the plasma assisted process employing a first reactant gas composition, a first radio frequency power and a first reactor chamber pressure;

undertaking a first plasma purge step for a first purge time immediately following the plasma assisted process, the first plasma purge step employing a first purge gas composition, a second radio frequency power and a second reactor chamber pressure, the second radio frequency power being lower than the first radio frequency power and the second reactor chamber pressure being higher than the first reactor chamber pressure.

18. The method of claim 17 wherein the first radio frequency power is from about 600 to about 950 watts and the first reactor chamber pressure is from about 200 to about 300 mtorr.

19. The method of claim 18 wherein the second radio frequency power is from about 250 to about 350 watts and the second reactor chamber pressure is from about 400 to about 900 mtorr.

20. The method of claim 18 further comprising undertaking a second plasma purge step for a second purge time immediately following the first plasma purge step, the second plasma purge step employing a second purge gas composition, a third radio frequency power and a third reactor chamber pressure, the third radio frequency power being no greater than the second radio frequency power and the third reactor chamber pressure being lower than the second reactor chamber pressure.

21. The method of claim 20 wherein the third radio frequency power is from about 50 to about 150 watts and the third reactor chamber pressure is no greater than about 200 mtorr.

22. A method for limiting contaminant particle deposition upon silicon oxide integrated circuit layers deposited within plasma assisted process reactor chambers comprising:

depositing through a plasma assisted process a silicon oxide integrated circuit layer within a plasma assisted process reactor chamber, the plasma assisted process employing a second reactant gas composition, a first radio frequency power and a first reactor chamber pressure;

undertaking a first plasma purge step for a first purge time immediately following the plasma assisted process, the first plasma purge step employing a first purge gas composition, a second radio frequency power and a second reactor chamber pressure, the second radio frequency power being lower than the first radio frequency power and the second reactor chamber pressure being higher than the first reactor chamber pressure.

23. The method of claim 22 wherein the first radio frequency power is from about 200 to about 700 watts and the first reactor chamber pressure is from about 500 to about 3000 mtorr.

24. The method of claim 23 wherein the second radio frequency power is from about 50 to about 300 watts and the second reactor chamber pressure is from about 2000 to about 7000 mtorr.

25. The method of claim 22 further comprising undertaking a second plasma purge step for a second purge time immediately following the first plasma purge step, the second plasma purge step employing a second purge gas composition, a third radio frequency power and a third reactor chamber pressure, the third radio frequency power being no greater than the second radio frequency power and the third reactor chamber pressure being lower than the second reactor chamber pressure.

26. The method of claim 25 wherein the third radio frequency power is from about 20 to about 150 watts and the third reactor chamber pressure is no greater than about 500 mtorr.

* * * * *